US010861943B2

(12) United States Patent
Lee et al.

(10) Patent No.: US 10,861,943 B2
(45) Date of Patent: Dec. 8, 2020

(54) TRANSISTOR WITH MULTIPLE GAN-BASED ALLOY LAYERS

(71) Applicant: TEXAS INSTRUMENTS INCORPORATED, Dallas, TX (US)

(72) Inventors: Dong Seup Lee, McKinney, TX (US); Jungwoo Joh, Allen, TX (US); Pinghai Hao, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/216,874

(22) Filed: Dec. 11, 2018

(65) Prior Publication Data
US 2020/0185499 A1    Jun. 11, 2020

(51) Int. Cl.
*H01L 29/20* (2006.01)
*H01L 29/778* (2006.01)
*H01L 29/66* (2006.01)

(52) U.S. Cl.
CPC .... *H01L 29/2003* (2013.01); *H01L 29/66462* (2013.01); *H01L 29/7786* (2013.01)

(58) Field of Classification Search
CPC ........... H01L 29/2003; H01L 29/66462; H01L 29/7786
See application file for complete search history.

(56) References Cited

U.S. PATENT DOCUMENTS

2007/0164315 A1 * 7/2007 Smith .................... H01L 21/318
                                                          257/194
2017/0365701 A1 * 12/2017 Kim .................... H01L 29/7786

* cited by examiner

*Primary Examiner* — Errol V Fernandes
(74) *Attorney, Agent, or Firm* — Jacqueline J. Garner; Charles A. Brill; Frank D. Cimino

(57) ABSTRACT

In some examples, a transistor comprises a gallium nitride (GaN) layer; a first GaN-based alloy layer having a top side and disposed on the GaN layer; a second GaN-based alloy layer disposed on the first GaN-based alloy layer, wherein the second GaN-based alloy layer covers a first portion of the top side; and a source contact structure, a drain contact structure, and a gate contact structure, wherein the source, drain, and gate contact structures are supported by the first GaN-based alloy layer.

17 Claims, 9 Drawing Sheets

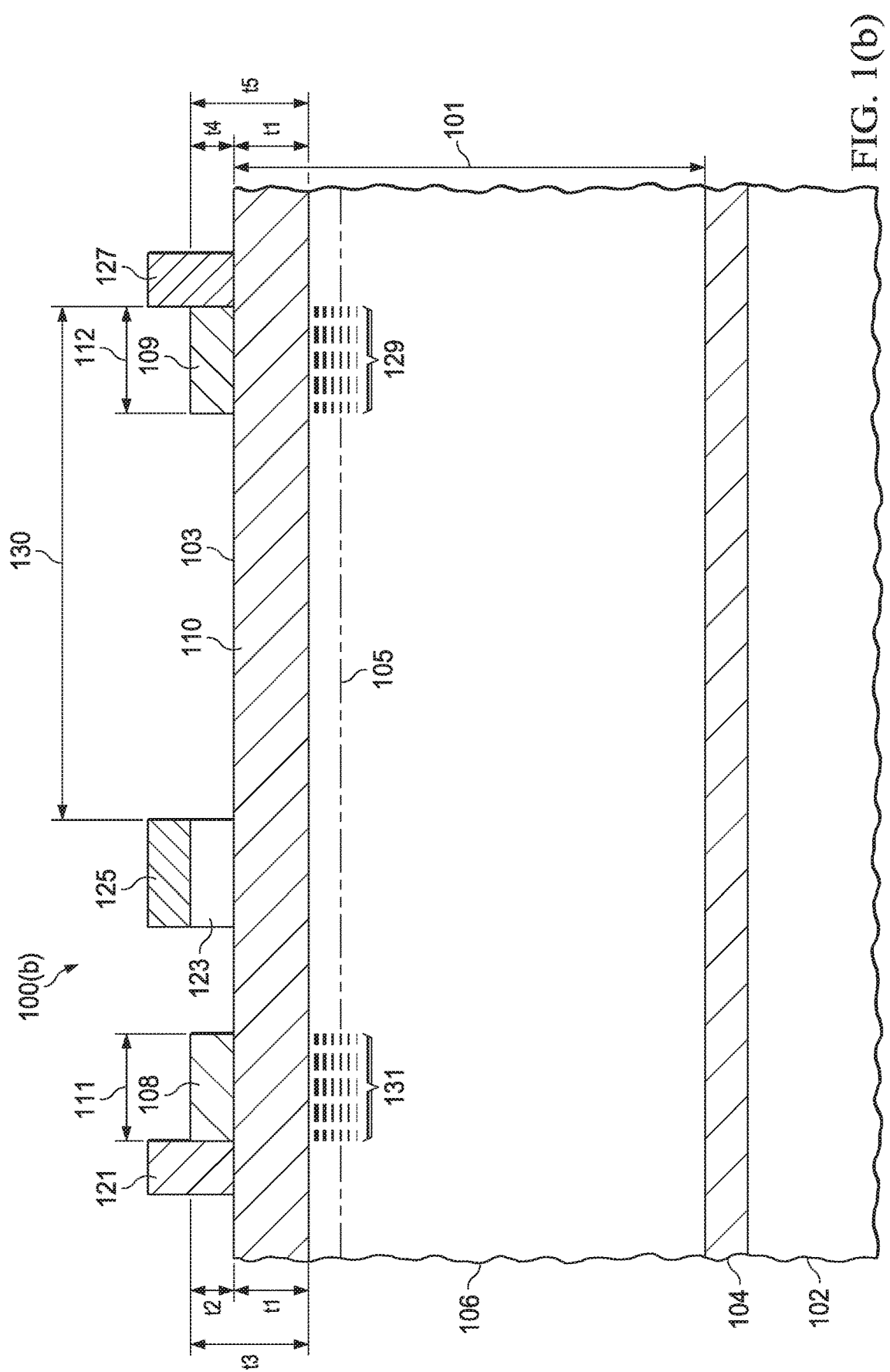

US 10,861,943 B2

TRANSISTOR WITH MULTIPLE GAN-BASED ALLOY LAYERS

BACKGROUND

Gallium nitride (GaN) based semiconductor devices deliver characteristics that are better than silicon-based devices. GaN-based semiconductor devices have faster-switching speed and excellent reverse-recovery performance, which is critical for low-loss and high-efficiency performance.

SUMMARY

In accordance with some examples, a transistor comprises a gallium nitride (GaN) layer; a first GaN-based alloy layer having a top side and disposed on the GaN layer; a second GaN-based alloy layer disposed on the first GaN-based alloy layer, wherein the second GaN-based alloy layer covers a first portion of the top side; and a source contact structure, a drain contact structure, and a gate contact structure, wherein the source, drain, and gate contact structures are supported by the first GaN-based alloy layer.

In accordance with some examples, a transistor comprises a gallium nitride (GaN) layer; a first GaN-based alloy layer positioned on the GaN layer; a second GaN-based alloy layer positioned on a first portion of the first GaN-based alloy layer, wherein a two-dimensional electron gas (2DEG) forms with different electron densities at an interface of the GaN layer and the first GaN-based alloy layer; and a source contact structure, a drain contact structure, and a gate contact structure, wherein the source, drain, and gate contact structures are supported by the first GaN-based alloy layer.

In accordance with some examples, a method, comprises providing a substrate including a gallium nitride (GaN) layer, a first GaN-based alloy layer disposed on the GaN layer and having a top side; forming a second GaN-based alloy layer disposed on a first portion of the first GaN-based alloy layer; and forming source, drain, and gate contact structures supported by the first GaN-based alloy layer.

BRIEF DESCRIPTION OF THE DRAWINGS

For a detailed description of various examples, reference will now be made to the accompanying drawings in which:

FIG. 1(b) depicts a cross-section of another illustrative GaN-based HEMT, in accordance with various examples;

DETAILED DESCRIPTION

Figure 1A:
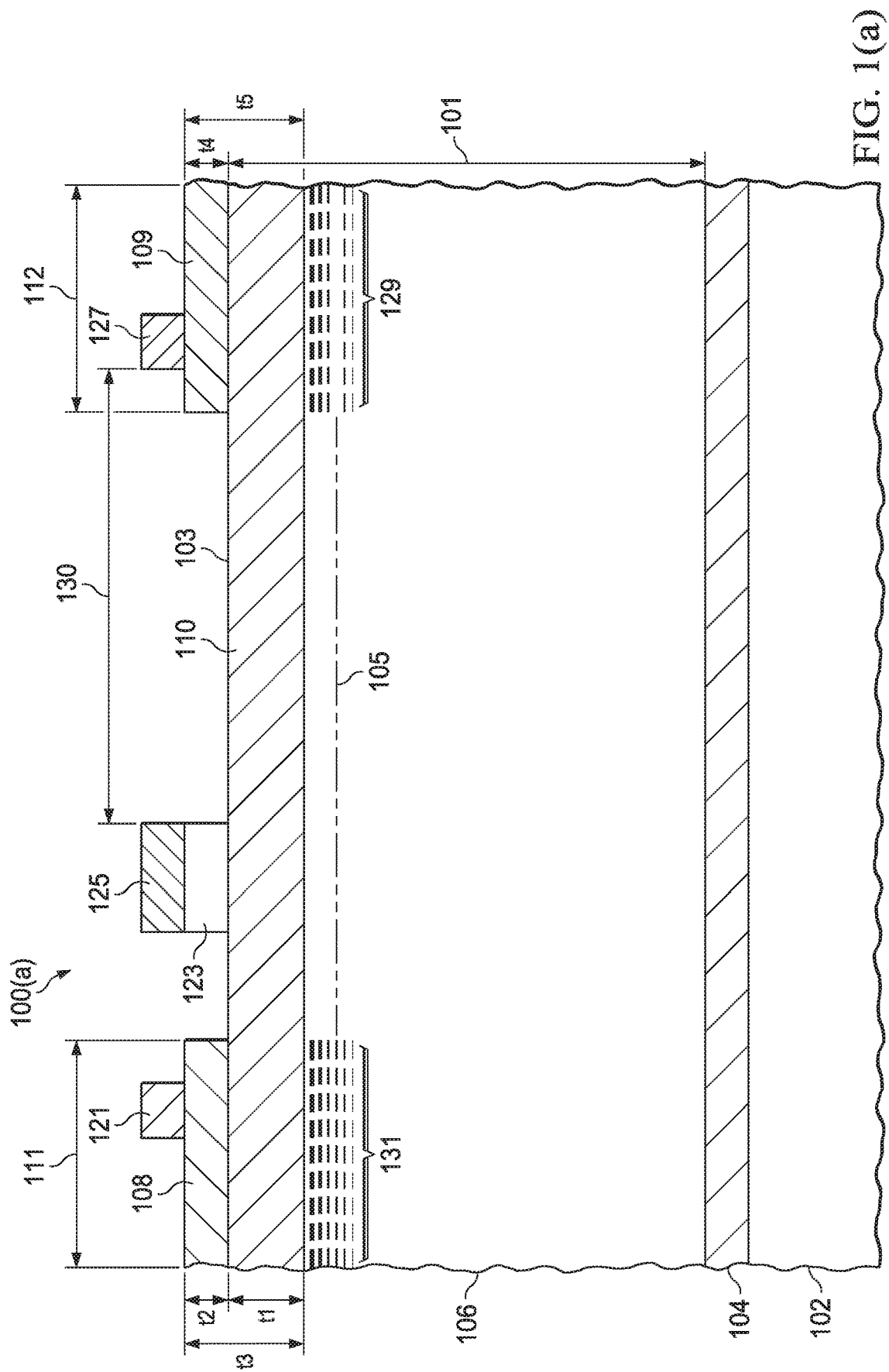
FIG. 1(a) depicts a cross-section of an illustrative GaN-based high electron mobility transistor (HEMT), in accordance with various examples.

High electron mobility transistors (HEMTs) typically include a layer of highly-mobile electrons, which are induced by forming a heterostructure including a group III nitride-based alloy with broader band-gap (e.g., aluminum gallium nitride (AlGaN)) grown over another group III nitride material with a narrower bandgap (e.g., GaN). The large conduction-band offset, spontaneous polarization, and piezoelectric polarization in such a heterostructure induce a highly-mobile 2-dimensional electron gas (2DEG) at their interface. For the sake of illustration, some of the description herein focuses on AlGaN/GaN heterostructures. However, this description is not limited to AlGaN/GaN-based heterostructures and can be applied to other heterostructures that can induce the 2DEG at their interface. Existing semiconductor fabrication techniques can be used to manufacture HEMTs using AlGaN/GaN-based heterostructures on a substrate (e.g., a semiconductor wafer).

HEMTs are fabricated such that the 2DEG is induced between the source and drain contact structures of the HEMT. To control the 2DEG, a gate contact structure is generally positioned between the source and drain contact structures. HEMTs can be classified as enhancement mode HEMTs (or e-HEMTs) or depletion mode HEMTs (or d-HEMTs). e-HEMTs are designed such that a depletion region forms under the gate contact structure at the AlGaN/GaN interface, meaning that electrons under the gate contact structure are depleted, making e-HEMTs normally-OFF devices. e-HEMTs can be turned ON by applying a positive threshold voltage to the gate contact structure. On the other hand, d-HEMTs are designed such that the 2DEG is always present at the AlGaN/GaN interface between the source and drain contact structures, meaning that d-HEMTs are normally-ON devices. d-HEMTs are turned OFF by applying a negative threshold voltage to the gate contact structure.

In high-voltage (e.g., operating voltage over 500V) applications, both enhancement and depletion mode HEMTs suffer from back gating effect in that a depletion region forms in a region under/around the drain contact structure due to a relative negative bias between the 2DEG and the substrate. Thus, both e-HEMTs and d-HEMTs, under the off-state, suffer from the back gating effect, which can result in the depletion region extending to the drain contact structure, which can then lead to failure of the HEMT. Although both enhancement and depletion mode HEMTs are prone to failure, this issue is significant in enhancement mode HEMTs. This is because the design of e-HEMTs permits a relatively low electron density in their 2DEG; especially in the case of e-HEMTs designed using p-type GaN based gate structures. Consequently, a depletion region may form and eventually extend to the drain contact structure at a voltage lower than the operating voltage.

The electron density of the 2DEG may be increased to prevent the extension of the depletion region to the drain contact region. However, increasing the electron density of the complete 2DEG positioned between the source and drain contact structure comes about with additional challenges. In e-HEMTs, increasing 2DEG electron density may result in a partially-ON (at zero gate voltage) HEMT. On the other hand, increasing 2DEG electron density in d-HEMTs increases the overall electric field of d-HEMTs and a more negative threshold voltage needs to be applied to the gate contact structure to turn the HEMT OFF. Other alternative techniques include injecting holes in the depletion region around the drain contact structure to reduce the extension of the depletion region. However, this technique suffers from the issue of the recombination current. Therefore, a solution that addresses the issues mentioned above is desired.

Accordingly, at least some of the examples disclosed herein are directed towards an HEMT with a modified design assembly. The modified design is equipped to prevent the extension of the depletion region towards the drain contact structure. In at least some examples, the modified design selectively increases the electron density of 2DEG under/below the drain contact structure. Increasing the thickness of the group III nitride-based alloy layer, such as AlGaN layer increases the electron density of the 2DEG at the group III nitride-based alloy layer/group III nitride layer (e.g., AlGaN/GaN) interface. Therefore, in at least some of the examples, the thickness of the group III nitride-based alloy layer is selectively increased below the drain contact structure to increase the electron density of the 2DEG present in the region below it. In some examples, the thickness of the group III nitride-based alloy layer is increased by growing an additional layer of the group III nitride-based alloy layer. In some examples, the thickness of the group III nitride-based alloy layer is increased in a drain access region to increase the electron density of the 2DEG in a region proximal to the drain contact structure. In some examples, the drain access region is a region between the gate and drain contact structures. In some examples, the thickness of the group III nitride-based alloy layer can be selectively increased by growing/depositing group III nitride-based alloy layer in the drain access region.

Referring now to FIG. 1(a), a cross-section of an illustrative GaN-based HEMT 100(a) (hereinafter HEMT 100(a)) with the modified design assembly is shown. HEMT 100(a) is an enhancement mode HEMT. HEMT 100(a) is fabricated on a substrate 102, which can include silicon, silicon carbide, sapphire, gallium nitride-based substrate or other suitable substrate material. In examples where silicon-based substrate is employed, the substrate 102 has a seed layer 104 deposited on the substrate 102. In some examples, the seed layer 104 has a thickness of 0.1-0.5 microns. In such examples, the seed layer 104 is used for the growth of the subsequent layers. In one example, the seed layer 104 includes is a group III nitride material, such as aluminum nitride (AlN). In other examples, other suitable materials that can facilitate the growth of the subsequent layers may be used as the seed layer 104. Depositing the seed layer 104 may be avoided in the examples where gallium-based substrate is employed HEMT 100(a) further includes a heterostructure 101 that includes a group III nitride-based alloy layer, i.e., AlGaN layer 110, and group-III based layer, i.e., GaN layer 106. In some examples, a buffer layer (not expressly depicted in FIG. 1(a)) between the seed layer 104 and the GaN layer 106 is grown. In other examples, the GaN layer 106 is grown on the seed layer 104. As noted above, For the sake of illustration, some of the description herein focuses on group III nitride-based alloy/group III nitride heterostructures, e.g., GaN-based alloy/GaN heterostructures. However, this description is not limited to GaN-based alloy/GaN heterostructures and can be applied to heterostructures made from other elements that can induce the 2DEG at their interface.

In some examples, the GaN layer 106 may be doped with carbon, or some other suitable dopant. To form the heterostructure 101, a layer of a group III nitride-based alloy layer, such as AlGaN 110 is grown over the GaN layer 106. The AlGaN layer 110 can be derived from a general form of a group III nitride-based alloy comprising: Al(X)In(Y)Ga(1-X-Y)N, where X and Y are the concentrations of Aluminum and Indium, respectively. In some examples, the AlGaN layer 110 may have a uniform composition. For example, a composition of Al(0.3)Ga(0.7)N uniformly forming the AlGaN layer 110. In other examples, AlGaN layer 110 may have a graded composition of Aluminum, Gallium, and Indium. For example, different compositions, such as Al(0.2)Ga(0.8)N; Al(0.1)Ga(0.9)N forming the AlGaN layer 110. In other examples, another variety/composition of GaN-based alloy can be grown on the GaN layer 106.

AlGaN layer 110 has a thickness t1 and top side 103. The top side 103 is sometimes referred to as top surface 103 in this disclosure. In some examples, the thickness of AlGaN layer 110 can be in the range of few nanometers (e.g., 5 nm) to tens of microns (e.g., 20 microns). In some examples, the thickness of GaN layer 106 can be in the range of few nanometers (e.g., 5 nm) to few microns (e.g., 50 um). FIG. 1(a) depicts a 2DEG 105 that is formed at the interface of the GaN layer 106 and the AlGaN layer 110. As noted above, 2DEG 105 is enabled by the large conduction band offset of the GaN layer 106 and the AlGaN layer 110.

The HEMT 100(a) further includes a source contact structure 121, a gate contact structure 125, and a drain contact structure 127. The source contact structure 121, the gate contact structure 125, and the drain contact structure 127 are supported by the AlGaN layer 110. The term "support" or "supported by" is intended to mean either an indirect or direct support. Thus, if the drain contact structure 127 is supported by the AlGaN layer 110, that support may be through a direct support or through an indirect support via other layers. HEMT 100(a) includes a p-doped GaN layer 123 (hereinafter pGaN layer 123) that is positioned on the top surface 103. In some examples, the p-doped GaN layer 123 can be formed from an alloy of aluminum, indium, gallium, nitride, and is not limited to using p-doped GaN. A gate contact structure 125 is positioned on the pGaN layer 123. The pGaN layer 123 enables HEMT 100(a) to function in the enhancement mode as the presence of the pGaN layer 123 depletes the electrons present in the 2DEG 105 under the pGaN layer 123. Due to this phenomenon, HEMT 100(a) is considered normally OFF and thus requires a positive threshold voltage applied at the gate contact structure 125 to turn it ON. The gate contact structure 125 forms, in one example, an ohmic contact with the pGaN layer 123. In other examples, a Schottky contact can be formed between the two.

As noted above, to selectively increase the thickness of the group III nitride-based alloy layer, or the AlGaN layer 110, HEMT 100(a) further includes a group III nitride-based alloy layer 109 disposed on the AlGaN layer 110, where the group III nitride-based alloy layer 109 covers a portion 112 of the top side 103. The group III nitride-based alloy layer 109 is sometimes referred to as GaN-based alloy layer 109. The group III nitride-based alloy layer 109 has a thickness t4. In some examples, the thickness t4 ranges between 1 nm and 500 nm. The group III nitride-based alloy layer 109 comprises Al(X1)In(Y1)Ga(1-X1-Y1)N, where X1 and Y1 are the concentrations of Aluminum and Indium, respectively. In some examples, the GaN-based alloy layer 109 may have a uniform composition. For example, a composition of Al(0.3)Ga(0.7)N uniformly forming the GaN-based alloy layer 109. In other examples, GaN-based alloy layer 109 may have a graded composition of Aluminum, Gallium, and Indium. For example, different compositions, such as Al(0.2)In(0)Ga(0.8)N; Al(0.1)In(0.2)Ga(0.7)N forming the GaN-based alloy layer 109.

In some examples, the drain contact structure 127 is supported by the GaN-based alloy layer 109. In some examples, the drain contact structure 127 forms an ohmic contact with the GaN-based alloy layer 109. The ohmic contact is a low resistance junction that provides current conduction between the source contact structure 121 and the AlGaN layer 110. In other examples, the drain contact structure 127 may form an ohmic contact with the AlGaN layer 110 such that at least a portion of the drain contact structure 127 is present above the GaN-based alloy layer 109. Due to the presence of the GaN-based alloy layer 109, the thickness of the layers extending below the drain contact structure 127 to the interface of AlGaN layer 110 and the GaN layer 106 is t5, which is equal to the sum of thicknesses t1 and t4. Increasing the thickness of the layers below the drain contact structure 127 increases the electron density of the 2DEG 105 (see a portion marked with numeral 129 in FIG. 1(a)) below the drain contact structure 127. The 2DEG 105 has different electron densities, meaning the electron density of the portion 129 is different (e.g., higher) from at least some of the other 2DEG 105. This prevents the extension of the depletion region towards the drain contact structure 127 and averts the depletion region from contacting the drain contact structure 127 and thus inhibits the failure of HEMT 100(a). In some examples, the composition of the GaN-based alloy layer 109 is different from the composition of the AlGaN layer 110. In other examples, the composition of the GaN-based alloy layer 109 is similar, in part, to the composition of the AlGaN layer 110. In other examples, the AlGaN layer 110 and the GaN-based alloy layer 109 can be grown as a single unit.

In some examples, HEMT 100(a) may further include another group III nitride-based alloy layer 108 disposed on the AlGaN layer 110, where the group III nitride-based alloy layer 108 covers a portion 111 of the top side 103. In some examples, the portions 111, 112 are of substantially same length. The group III nitride-based alloy layer 108 has a thickness t2. In some examples, the thickness t2 ranges between 1 nm and 500 nm. The group III nitride-based alloy layer 108 comprises Al(X2)In(Y2)Ga(1-X2-Y2)N, where X2 and Y2 are the concentrations of Aluminum and Indium, respectively. In some examples, the GaN-based alloy layer 108 may have a uniform composition. For example, a composition of Al(0.3)Ga(0.7)N uniformly forming the group III nitride-based alloy layer 108. In other examples, group III nitride-based alloy layer 108 may have a graded composition of Aluminum, Gallium, and Indium. For example, different compositions, such as Al(0.2)In(0)Ga (0.8)N; Al(0.1)In(0.2)Ga(0.7)N forming the group III nitride-based alloy layer 108. The group III nitride-based alloy layer 108 is sometimes referred to as GaN-based alloy layer 108 in this disclosure.

Due to the presence of the GaN-based alloy layer 108, the thickness of the layers extending below the source contact structure 121 to the interface of AlGaN layer 110 and the GaN layer 106 is t3, which is equal to the sum of thicknesses t1 and t2. Increasing the thickness of the layers below the source contact structure 121 improves the on resistance of the HEMT 100(a) by increasing the electron density of the 2DEG 105 (see a portion marked with numeral 131 in FIG. 1(a)) below the source contact structure 121. In some examples, the composition of the GaN-based alloy layer 108 is different from the composition of the AlGaN layer 110 and the GaN-based alloy layer 109. In other examples, the composition of the GaN-based alloy layer 108 is similar to the composition of the AlGaN layer 110 and the GaN-based alloy layer 109.

FIG. 1(a) depicts the HEMT 100(a) including GaN-based alloy layers 108, 109 positioned below the source and drain contact structures 127, 121, respectively. In some examples, only GaN-based alloy layer 109 is present. In such an example, the source contact structure 121 forms an ohmic contact with the AlGaN layer 110.

FIG. 1(a) further depicts a drain access region 130. In some examples, the drain access region 130 is a region at the AlGaN layer 110/GaN layer 106 interface between the gate contact structure 125 and the drain contact structure 127. FIG. 1(a) shows the GaN-based alloy layers 109 partially extending into the drain access region 130 and contacting the drain contact structure 127.

Referring now to FIG. 1(b), a cross-section of an illustrative GaN-based HEMT 100(b) (hereinafter HEMT 100 (b)) with another modified design assembly is shown. HEMT 100(b) is designed to function in the enhancement mode. HEMT 100(b) has a similar structure as HEMT 100(a) except for the position of the GaN-based alloy layers 108, 109. The description of FIG. 1(a) provided above also applies to FIG. 1(b).

In the example shown in FIG. 1(b), the GaN-based alloy layers 108, 109 are positioned in the drain access region 130. In this example, the drain and source contact structures 127, 121, respectively, form an ohmic contact with the AlGaN layer 110. The GaN-based alloy layer 109 is configured to increase the electron density of the 2DEG 105 (see the portion marked with numeral 129 in FIG. 1(b)) below the GaN-based alloy layer 109 at the interface of the AlGaN layer 110/GaN layer 106 in the drain access region 130. This prevents the extension of a depletion region (not expressly shown) towards the drain contact structure 127. The GaN-based alloy layer 108 increases the electron density of the 2DEG 105 (see the portion marked with numeral 131 in FIG. 1(b)) in the region below the GaN-based alloy layer 108 at the interface of the AlGaN layer 110/GaN layer 106. This increases the ON resistance of the HEMT 100(b).

Figure 2A:
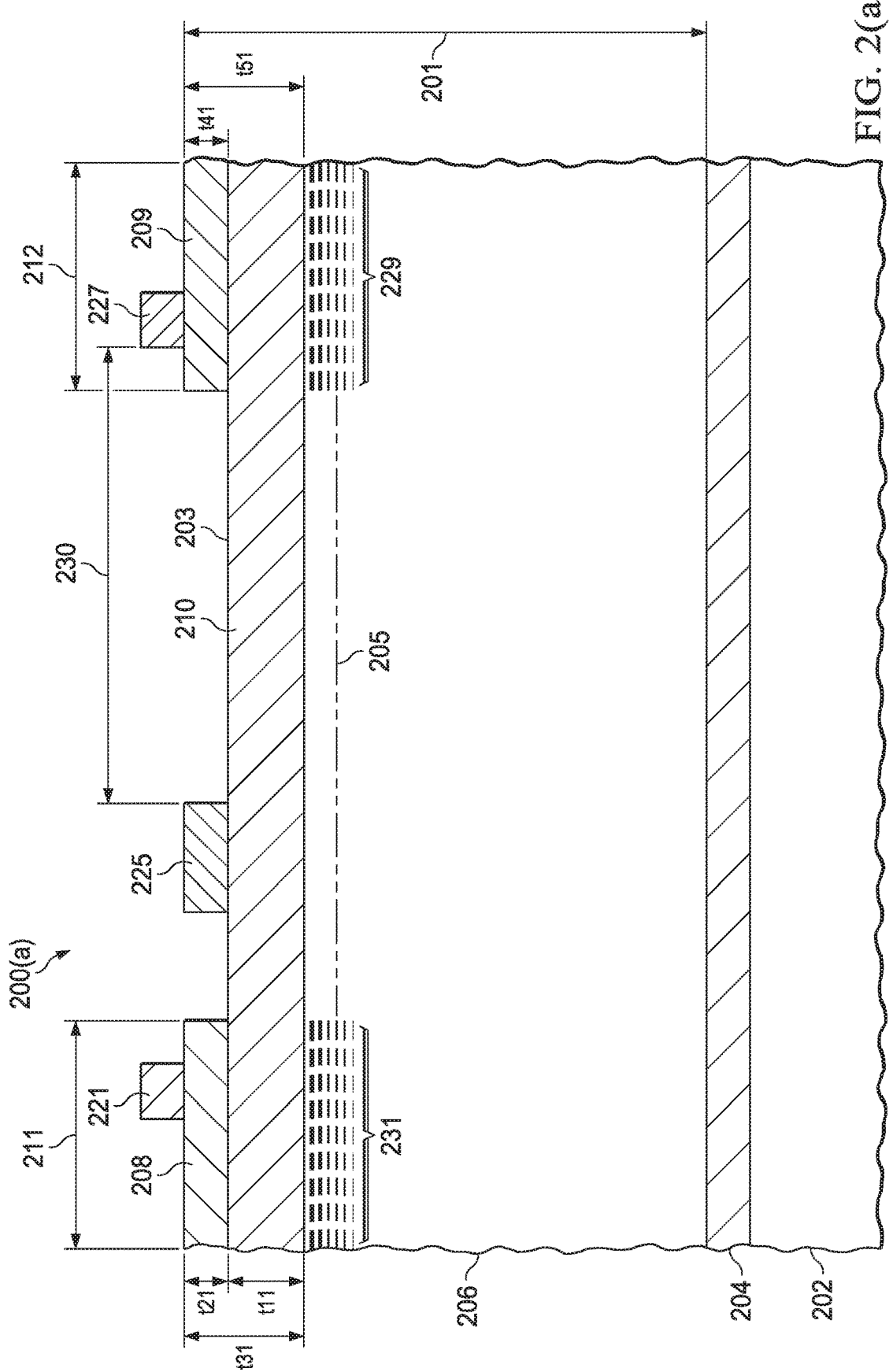
FIG. 2(a) depicts a cross-section of yet another illustrative GaN-based HEMT, in accordance with various examples.

Referring now to FIG. 2(a), a cross-section of yet another illustrative GaN-based HEMT 200(a) (hereinafter HEMT 200(a)) with the modified design assembly is shown. HEMT 200(a) functions in a depletion mode—meaning that HEMT 200(a) is normally ON and requires a negative threshold voltage to be applied to the gate contact structure 225. The 2DEG 205 of FIG. 2(a) forms a channel of electrons between the source and drain contact structures 221, 227, respectively. The absence of pGaN layer 123 (see FIG. 1(a)) enables HEMT 200(a) to function in the depletion mode. HEMT 200(a) is fabricated on a substrate 202, which can include silicon, silicon carbide, sapphire, or other suitable substrate material. In examples where silicon-based substrate is employed, the substrate 202 has a seed layer 204 deposited on the substrate 202. In some examples, the seed layer 204 has a thickness of 0.1-0.5 microns. In such examples, the seed layer 204 is necessary for the growth of the subsequent layers. In one example, the seed layer 204 includes is a group III nitride material, such as aluminum nitride (AlN). In other examples, other suitable materials that can facilitate the growth of the subsequent layers may be used as the seed layer 204. Depositing the seed layer 204 may be avoided in the examples where gallium-based substrate is employed. HEMT 200(a) further includes a heterostructure 201 that includes a group III nitride-based alloy, i.e., AlGaN layer 210 and group-III based layer, i.e., GaN layer 206. GaN layer 206 is grown on the seed layer 204. As noted above, For the sake of illustration, some of the description herein focuses on group III nitride-based alloy/ group III nitride heterostructures, e.g., GaN-based alloy/ GaN heterostructures. However, this description is not limited to GaN-based alloy/GaN heterostructures and can be applied to heterostructures made from other elements that can induce the 2DEG at their interface. In the aforementioned description, group III and V are the group of elements of the widely known periodic table of elements.

The description of GaN layer 106 provided above for FIG. 1(a) applies to GaN layer 206 of FIG. 2(a) and the description of AlGaN layer 110 provided above applies to the AlGaN layer 210 of FIG. 2(a). HEMT 200(a) includes a group III nitride-based alloy layer 209 disposed on the AlGaN layer 210, where the group III nitride-based alloy layer 209 covers a portion 212 of the top side 203. The group III nitride-based alloy layer 209 has a thickness t41 and the AlGaN layer 210 has a thickness t11. In some examples, the thickness t41 ranges from 5 nm and 500 nm. The group III nitride-based alloy layer 209 comprises Al(X3)In(Y3)Ga(1-X3-Y3)N, where X3 and Y3 are the concentrations of Aluminum and Indium, respectively. The group III nitride-based alloy layer 209 is sometimes herein referred to as GaN-based alloy layer 209. In some examples, the GaN-based alloy layer 209 may have a uniform composition. For example, a composition of Al(0.3)Ga(0.7)N uniformly forming the GaN-based alloy layer 209. In other examples, GaN-based alloy layer 209 may have a graded composition of Aluminum, Gallium, and Indium. For example, different compositions, such as Al(0.2)In(0)Ga(0.8)N; Al(0.1)In(0.2)Ga(0.7)N may form the GaN-based alloy layer 209. The source contact structure 221, the gate contact structure 225, and the drain contact structure 227 are supported by the AlGaN layer 210. In some examples, the drain contact structure 227 forms an ohmic contact with the GaN-based alloy layer 209. In other examples, the drain contact structure 227 may form an ohmic contact with the AlGaN layer 210 such that at least a portion of the drain contact structure 227 is present above the GaN-based alloy layer 209. Due to the presence of the GaN-based alloy layer 209, the thickness of the layers extending below the drain contact structure 227 to the interface of AlGaN layer 210 and the GaN layer 206 is t5, which is equal to the sum of thicknesses t11 and t41. As noted above, increasing the thickness of the layers below the drain contact structure 227 increases the electron density of the 2DEG 105 (see a portion marked with numeral 229 in FIG. 2(A) below the drain contact structure 227. This prevents the extension of the depletion region towards the drain contact structure 227 and inhibits the depletion region from contacting the drain contact structure 227 and thus inhibits the failure of HEMT 200(a). In some examples, the composition of the GaN-based alloy layer 209 is different from the composition of the AlGaN layer 210. In other examples, the composition of the GaN-based alloy layer 209 is similar, in part, to the composition of the AlGaN layer 210.

In some examples, HEMT 200(a) includes another group III nitride-based alloy layer 208 disposed on the AlGaN layer 210, where the group III nitride-based alloy layer 208 covers a portion 211 of the top side 203. The group III nitride-based alloy layer 208 has a thickness t21. In some examples, the thickness t21 ranges between 5 nm and 500 nm. The group III nitride-based alloy layer 208 comprises Al(X4)In(Y4)Ga(1-X4-Y4)N, where X4 and Y4 are the concentrations of Aluminum and Indium, respectively. The group III nitride-based alloy layer 208 is sometimes herein referred to as GaN-based alloy layer 208. In some examples, the GaN-based alloy layer 208 may have a uniform composition. For example, a composition of Al(0.3)Ga(0.7)N uniformly forming the GaN-based alloy layer 208. In other examples, GaN-based alloy layer 208 may have a graded composition of Aluminum, Gallium, and Indium. For example, different compositions, such as Al(0.2)In(0)Ga(0.8)N; Al(0.1)In(0.2)Ga(0.7)N may form the GaN-based alloy layer 208. Due to the presence of the GaN-based alloy layer 208, the thickness of the layers extending below the source contact structure 221 to the interface of AlGaN layer 210 and the GaN layer 206 is t31, which is equal to the sum of thicknesses t11 and t21. Increasing the thickness of the layers below the source contact structure 221 improves the on resistance of the HEMT 200(a) by increasing the electron density of the 2DEG 105 (see a portion marked with numeral 231 in FIG. 2(a)) below the source contact structure 221. In some examples, the composition of the GaN-based alloy layer 208 is different from the composition of the AlGaN layer 210 and the GaN-based alloy layer 209. In other examples, the composition of the GaN-based alloy layer 208 is similar to the composition of the AlGaN layer 210 and the GaN-based alloy layer 209.

FIG. 2(a) depicts the HEMT 200(a) including GaN-based alloy layers 208, 209 positioned below the source and drain contact structures 221, 227, respectively. In some examples, only GaN-based alloy layer 209 is present. In such an example, the source contact structure 221 forms an ohmic contact with the AlGaN layer 210. FIG. 2(A) further depicts a drain access region 230. In some examples, the drain access region 230 is a region between the gate contact structure 225 and the drain contact structure 227 at the AlGaN layer 210/GaN layer 206 interface. FIG. 2(A) shows the GaN-based alloy layers 209 partially extending into the drain access region 230. In other examples, the GaN-based alloy layers 209 may not extend into the drain access region 230.

Figure 2B:
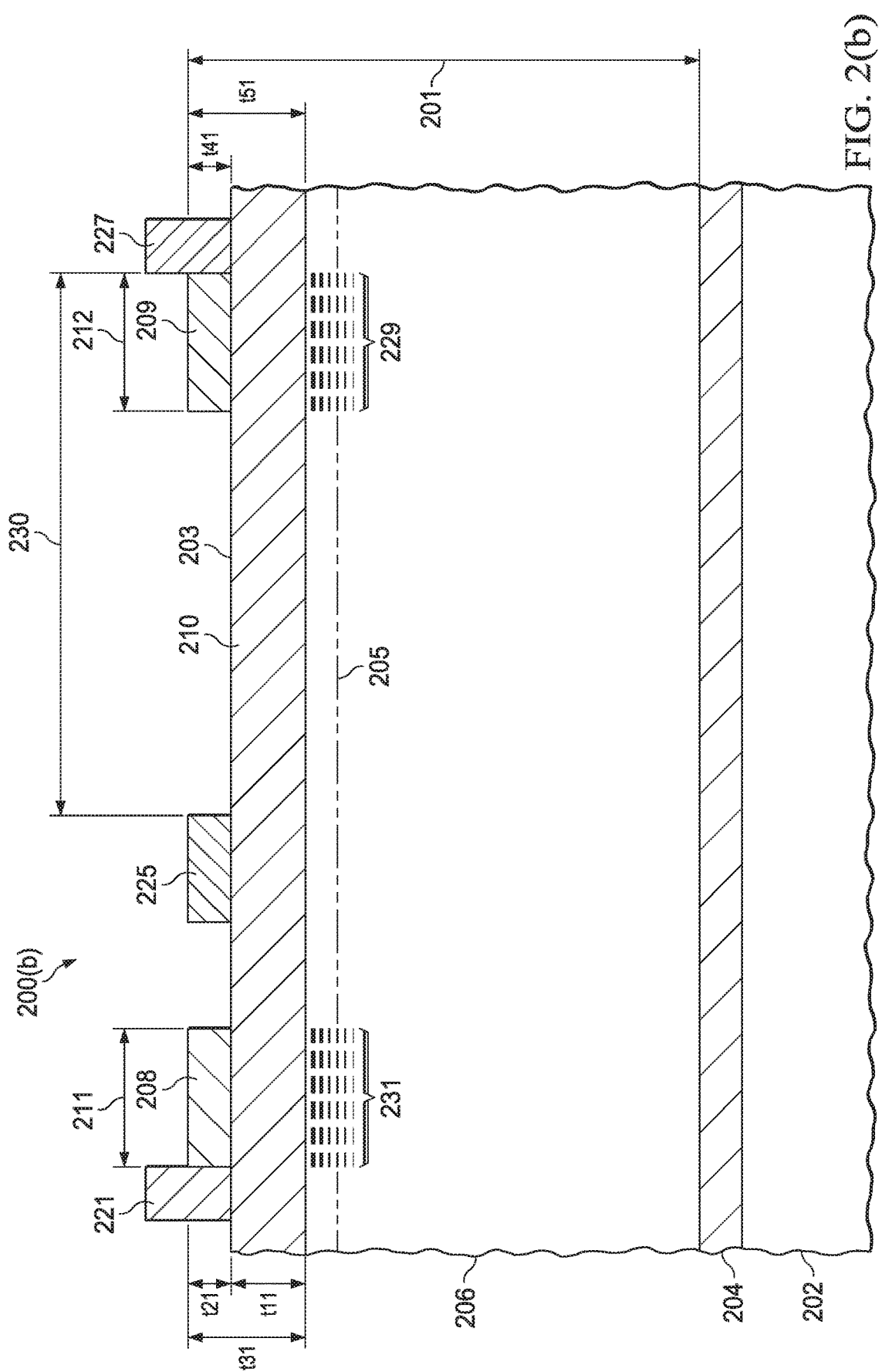
FIG. 2(b) depicts a cross-section of yet another illustrative GaN-based HEMT, in accordance with various examples.

Referring now to FIG. 2(b), a cross-section of an illustrative GaN-based HEMT 200(b) (hereinafter HEMT 200(b)) with another modified design assembly is shown. HEMT 200(b) also functions in the depletion mode. HEMT 200(b) has a similar structure as HEMT 200(a) except for the position of the GaN-based alloy layers 208, 209. The description of FIG. 2(a) provided above also applies to FIG. 2(b). In the example shown in FIG. 2(b), the GaN-based alloy layer 209 is positioned in the drain access region 230. In this example, the drain contact structure 227 forms an ohmic contact with the AlGaN layer 210. The GaN-based alloy layer 209 is configured to increase the electron density of the 2DEG 205 (see the portion marked with numeral 229 in FIG. 2(b)) below the GaN-based alloy layer 209 at the interface of the AlGaN layer 210/GaN layer 206 in the drain access region 230. This prevents the extension of a depletion region (not expressly shown) towards the drain contact structure 227. The GaN-based alloy layer 208 increases the electron density of the 2DEG 205 (see the portion marked with numeral 231 in FIG. 2(b)) in the region below the GaN-based alloy layer 208 at the interface of the AlGaN layer 210/GaN layer 206. This increases the ON resistance of the HEMT 200(b). In some examples, HEMT 200(b) includes the GaN-based alloy layer 208 and excludes the GaN-based alloy layer 209.

Figure 3:
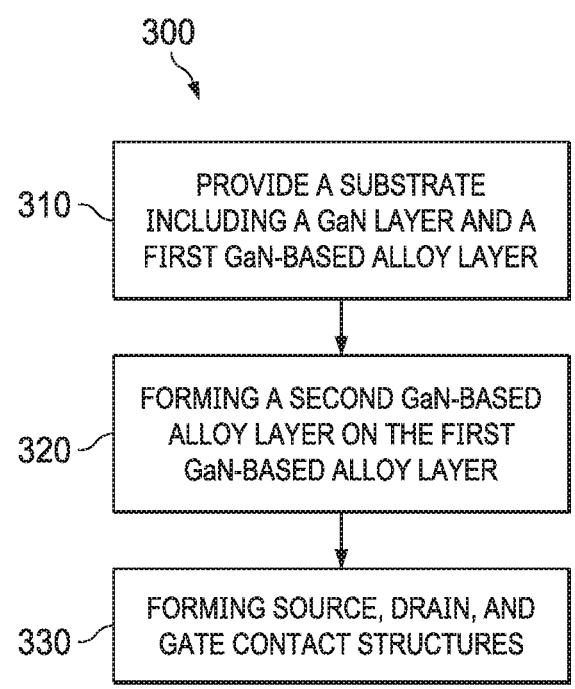
FIG. 3 depicts an illustrative method 300 to fabricate an illustrative GaN-based HEMT, in accordance with various examples.

FIG. 3 depicts an illustrative method 300 to fabricate the HEMT with the modified design. FIGS. 4(a)-4(d) are illustrative flow diagrams depicting at least some of the steps involved in fabricating such HEMT. The method 300 is now described in tandem with FIG. 4(a)-FIG. 4(d).

Figure 4A:
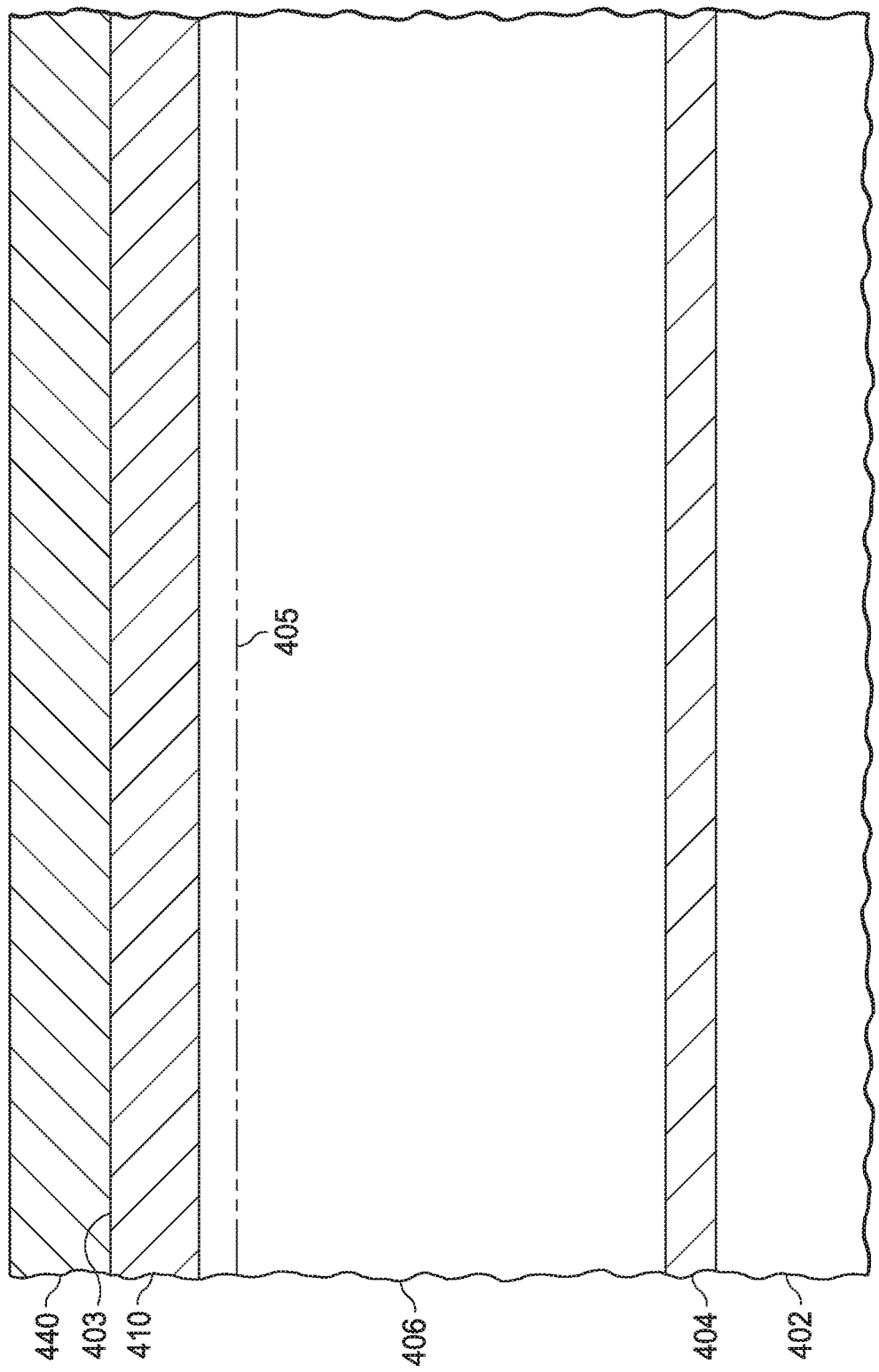
FIGS. 4(a)-4(d) depicts illustrative flow diagrams including the steps involved in fabricating an illustrative GaN-based HEMT, in accordance with various examples.

The method 300 begins with obtaining/providing a substrate 402 including a GaN layer 406 and a group III nitride-based alloy layer 410 (step 310; FIG. 4(a)). The GaN layer 410 having a top side 403. FIG. 4(a) also depicts another GaN-based alloy layer 440, which, in subsequent steps, will be used to cover one or more portions of the top side 403. The GaN layer 406 is grown on a seed layer 404 using chemical vapor deposition, or using other suitable processes. The group III nitride-based alloy layer 410 is grown on the GaN layer 406 using chemical vapor deposition, or using other suitable processes, and the group III nitride-based alloy layer 440 is grown on the group III nitride-based alloy layer 410 using chemical vapor deposition, or using other suitable processes. In some examples, other types of deposition methods, such as molecular epitaxy deposition may be used to deposit the GaN layer 406 and the group III nitride-based alloy layers 410, 440. For illustration sake, it is assumed that the substrate 402 includes silicon; the composition of GaN layer 406 is GaN; the composition of group III nitride-based alloy layer 410 is Al(0.3)Ga(0.7)N; and the composition of group III nitride-based alloy layer 440 is Al(0.4)Ga(0.6)N. In other examples, the group III nitride-based alloy layer 410 can assume a composition of Al(X)In(Y)Ga(1-X-Y)N, where X and Y are the concentrations of Aluminum and Indium, respectively. FIG. 4(a) also depicts a 2DEG 405 formed at the group III nitride-based alloy layer 410/GaN layer 406 interface. The group III nitride-based alloy layer 410 and the GaN layer 406, due to a polarization discontinuity, forms the 2DEG 405 at the group III nitride-based alloy layer 410/GaN layer 406 interface. The group III nitride-based alloy layer 410 is sometimes herein referred to as GaN-based alloy layer 410.

Figure 4B:
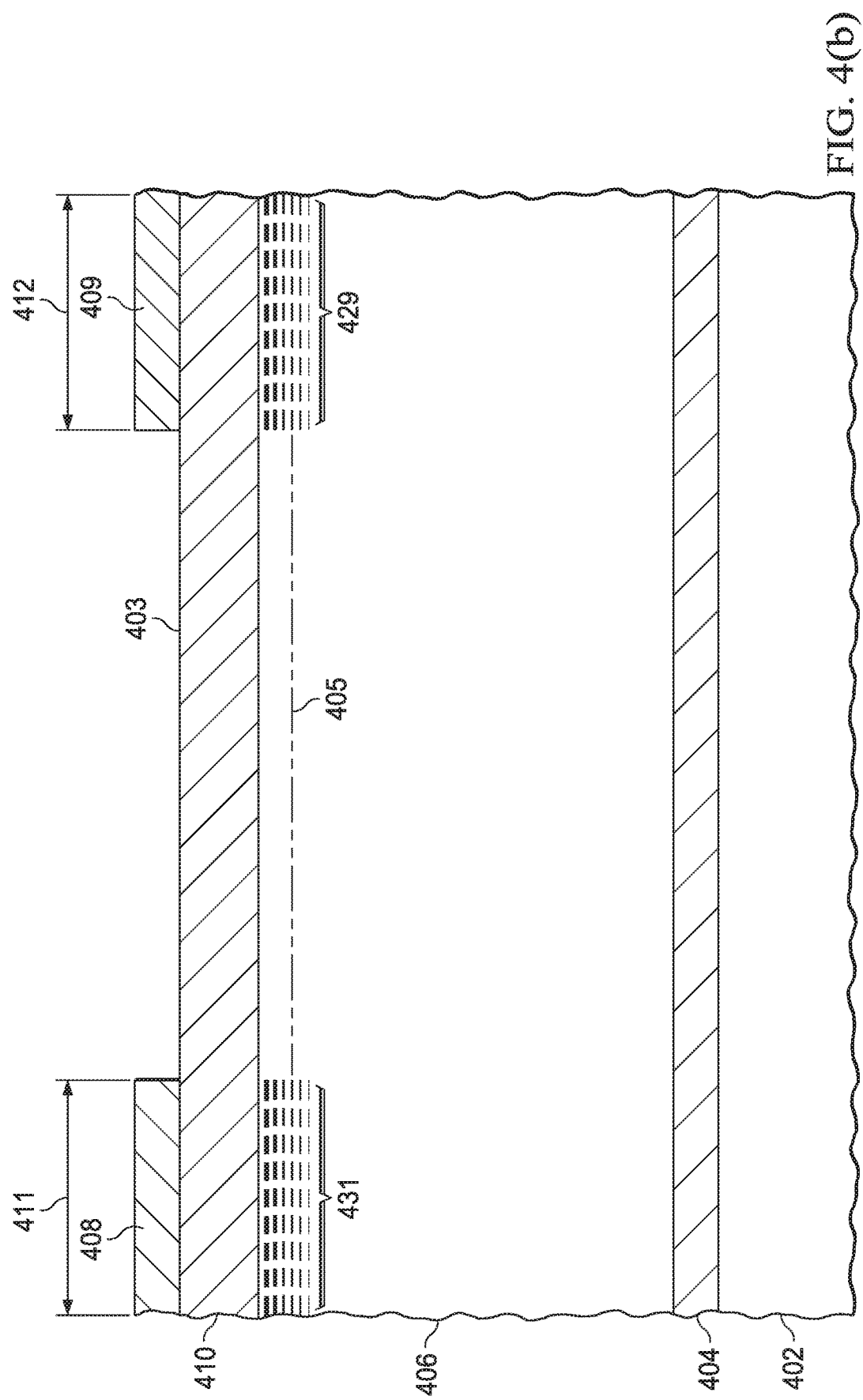
Figure 4C:
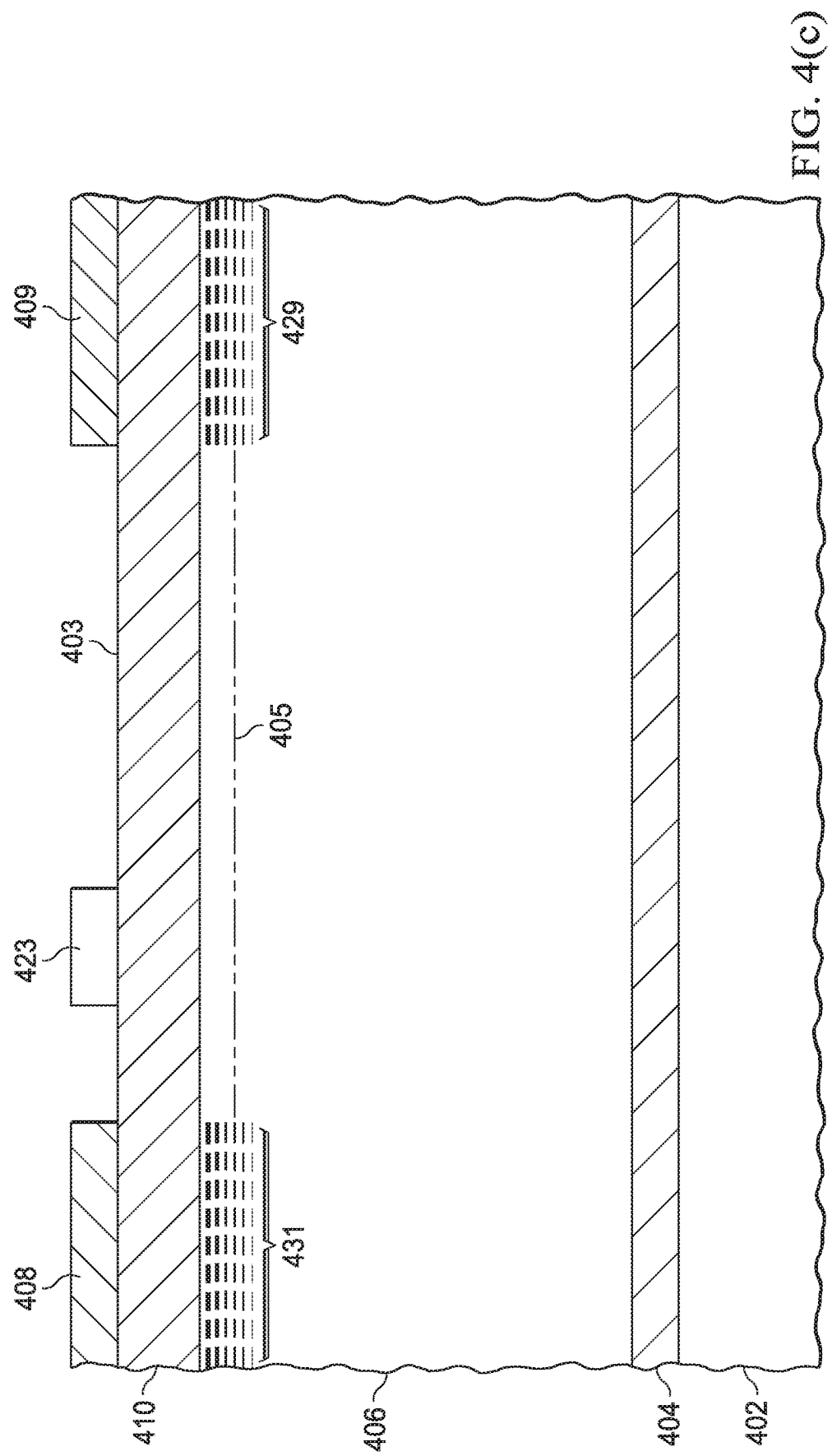
Figure 4D:
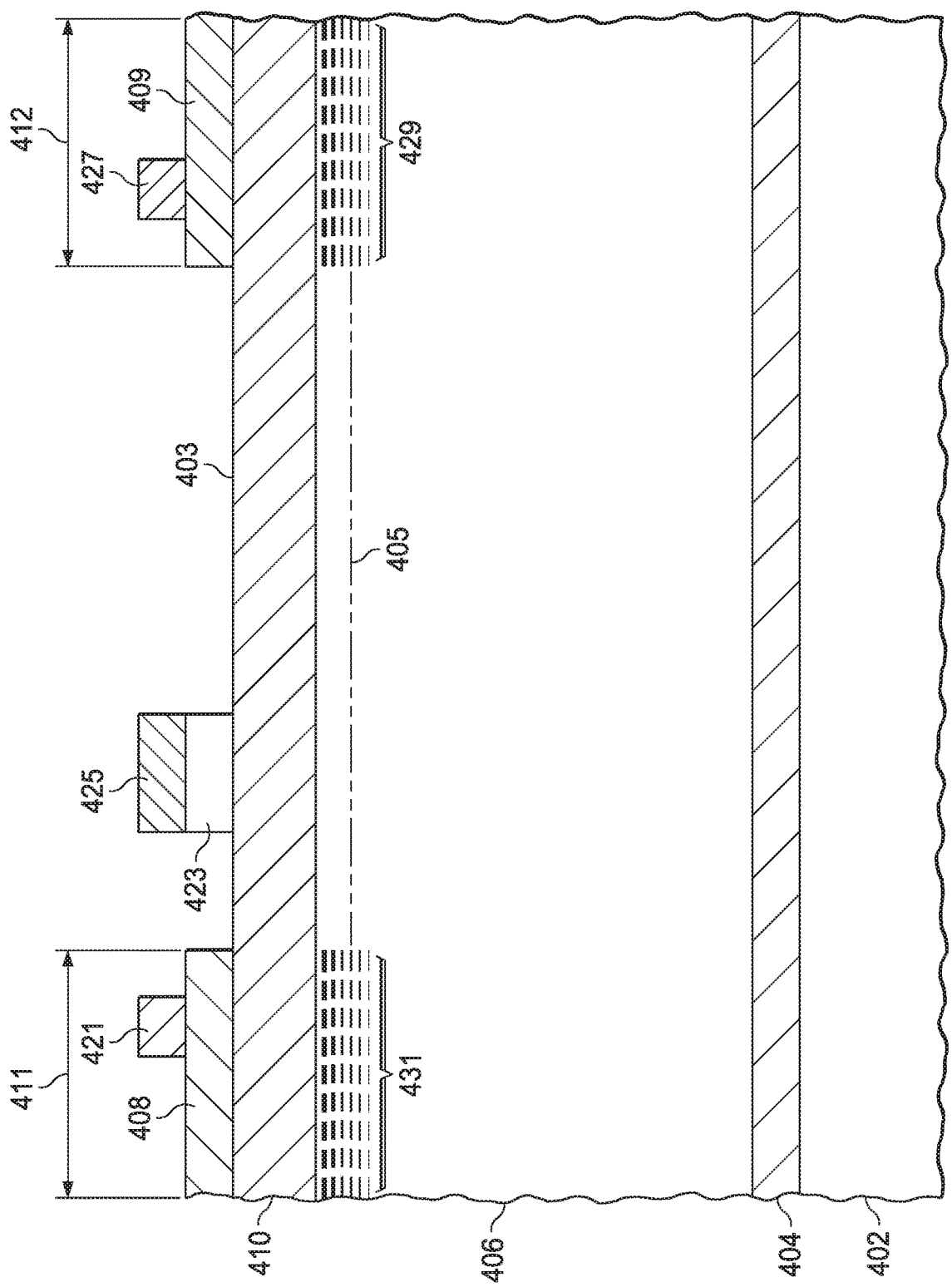

The method 300 proceeds to a step 320 that includes forming a GaN-based alloy layer 409 disposed on a portion 412 of the GaN-based alloy layer 410 (see FIG. 4(b)). The group III nitride-based alloy layer 409 is sometimes herein referred to as GaN-based alloy layer 409. This can be done by masking the GaN-based alloy layer 440 (FIG. 4(a)). Masking may include using a dry film or a photoresist film, which covers the top surface of the GaN-based alloy layer 440 using a suitable coating process, which may be followed by curing, descum, and the like, further followed by lithography technology and/or etching processes, such as a dry etch and/or a wet etch process, to form the GaN-based alloy layer 409 disposed on a portion 412. The presence of the GaN-based alloy layer 409 increases the electron density of the 2DEG 405 below the GaN-based alloy layer 409 at the GaN-based alloy layer 410/GaN layer 406 interface (see a portion of the 2DEG 405 marked with the numeral 429). In some examples, the above-mentioned masking can be performed so as to form another group III nitride-based alloy layer 408 that is disposed on a portion 411 of the top side 403. The group III nitride-based alloy layer 408 is sometimes referred herein as GaN-based alloy layer 408. The presence of the GaN-based alloy layer 408 increases the electron density of the 2DEG 405 below the GaN-based alloy layer 408 at the GaN-based alloy layer 410/GaN layer 406 interface (see a portion of the 2DEG 405 marked with the numeral 431). In other examples, the GaN-based alloy layers 408, 409 may be formed using regrowth process—instead of using the etching process disclosed herein.

In the examples where the HEMT being fabricated is an enhancement mode HEMT (e-HEMT), the method 300 includes forming a p-type GaN layer (or pGaN) 423 on the top side 403. The pGaN layer 423 (FIG. 4(c)) enables the HEMT (being fabricated) to function in the enhancement mode. The pGaN layer 423 can be formed by first depositing a pGaN layer on the top side 403 and then selectively etching the deposited pGaN layer to form the pGaN layer 423. It can be observed that 2DEG 405 is depleted from the GaN-based alloy layer 410/GaN layer 406 interface under the pGaN layer 423. In the case of e-HEMT, following forming the pGaN layer 423, the method 300 proceeds to step 330 that includes forming source, drain, and gate contact structures 421, 427, and 425, respectively. Following the deposition of pGaN layer 423, the method 300 proceeds to step 330 that includes forming source, drain, and gate contact structures, which utilizes a deposition process, for instance a metal-deposition process (sputter, evaporation, etc.). In examples where the HEMT being fabricated is a depletion mode HEMT, the method 300, following step 320 proceeds to step 330 without forming the pGaN layer 423.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A transistor, comprising:
   a gallium nitride (GaN) layer;
   a first GaN-based alloy layer having a top side and disposed on the GaN layer;
   a second GaN-based alloy layer disposed on the first GaN-based alloy layer, wherein the second GaN-based alloy layer covers a first portion of the top side; and
   a source contact structure, a drain contact structure, and a gate contact structure, wherein the source, drain, and gate contact structures are supported by the first GaN-based alloy layer, wherein the drain contact structure disposed on the second GaN-based alloy layer such that the drain contact structure is separated from the first GaN-based alloy layer by the second GaN-based alloy layer.

2. The transistor of claim 1 further comprising a third GaN-based alloy layer disposed on the first GaN based alloy layer, the third GaN-based alloy layer covers a second portion of the top side.

3. The transistor of claim 2, wherein the drain contact structure forms an ohmic contact with the second GaN-based alloy layer, the source contact structure forms an ohmic contact with the third GaN-based alloy layer.

4. The transistor of claim 2, wherein the first and second portions are of same lengths.

5. The transistor of claim 2, wherein the first GaN-based alloy layer comprises Al(X1)In(Y1)Ga(1-X1-Y1)N, where X1 and Y1 are the concentrations of Aluminum and Indium, respectively, wherein the second GaN-based alloy layer comprises: Al(X2)In(Y2)Ga(1-X2-Y2)N, where X2 and Y2 are the concentrations of Aluminum and Indium, respectively, wherein the third GaN-based alloy layer comprises Al(X3)In(Y3)Ga(1-X3-Y3)N, where X3 and Y3 are the concentrations of Aluminum and Indium, respectively.

6. The transistor of claim 1, wherein the drain contact structure forms an ohmic contact with the second GaN-based alloy layer, the source contact structure forms an ohmic contact with the first GaN-based alloy layer.

7. The transistor of claim 1, wherein the second GaN-based alloy layer is at least partially positioned in a drain access region and contacts the drain contact structure.

8. A transistor, comprising:
a gallium nitride (GaN) layer;
a first GaN-based alloy layer having a top side and disposed on the GaN layer;
a second GaN-based alloy layer disposed on the first GaN-based alloy layer, wherein the second GaN-based alloy layer covers a first portion of the top side;
a source contact structure, a drain contact structure, and a gate contact structure, wherein the source, drain, and gate contact structures are supported by the first GaN-based alloy layer; and
a p-doped GaN layer positioned on the top side, wherein the gate contact structure is positioned on the p-doped GaN layer.

9. A transistor, comprising:
a gallium nitride (GaN) layer;
a first GaN-based alloy layer positioned on the GaN layer;
a second GaN-based alloy layer positioned on a first portion of the first GaN-based alloy layer, wherein a two-dimensional electron gas (2DEG) forms with different electron densities at an interface of the GaN layer and the first GaN-based alloy layer;
a source contact structure, a drain contact structure, and a gate contact structure, wherein the source, drain, and gate contact structures are supported by the first GaN-based alloy layer; and
a p-doped GaN layer positioned on a second portion of the first GaN-based alloy layer, wherein the gate contact structure is positioned on the p-doped GaN layer.

10. The transistor of claim 9 further comprising a third GaN-based alloy layer positioned on a third portion of the first GaN-based alloy layer, wherein the source contact structure contacts the third GaN-based alloy layer and the drain contact structure contacts the second GaN-based alloy layer.

11. The transistor of claim 10, wherein the first GaN-based alloy layer comprises Al(X1)In(Y1)Ga(1-X1-Y1)N, where X1 and Y1 are the concentrations of Aluminum and Indium, respectively, wherein the second GaN-based alloy layer comprises: Al(X2)In(Y2)Ga(1-X2-Y2)N, where X2 and Y2 are the concentrations of Aluminum and Indium, respectively, wherein the third GaN-based alloy layer comprises Al(X3)In(Y3)Ga(1-X3-Y3)N, where X3 and Y3 are the concentrations of Aluminum and Indium, respectively.

12. A method, comprising:
providing a substrate including a gallium nitride (GaN) layer, a first GaN-based alloy layer disposed on the GaN layer and having a top side;
forming a second GaN-based alloy layer disposed on a first portion of the first GaN-based alloy layer; and
forming source, drain, and gate contact structures supported by the first GaN-based alloy layer, the drain contact structure being separated from the first GaN-based alloy layer by the second GaN-based alloy layer.

13. The method of claim 12 further comprising forming a third GaN-based alloy layer disposed on a second portion of the first GaN-based alloy layer.

14. The method of claim 12, wherein the first GaN-based alloy layer comprises Al(X1)In(Y1)Ga(1-X1-Y1)N, where X1 and Y1 are the concentrations of Aluminum and Indium, respectively, wherein the second GaN-based alloy layer comprises: Al(X2)In(Y2)Ga(1-X2-Y2)N, where X2 and Y2 are the concentrations of Aluminum and Indium, respectively, wherein the third GaN-based alloy layer comprises Al(X3)In(Y3)Ga(1-X3-Y3)N, where X3 and Y3 are the concentrations of Aluminum and Indium, respectively.

15. A method, comprising:
providing a substrate including a gallium nitride (GaN) layer, a first GaN-based alloy layer disposed on the GaN layer and having a top side;
forming a second GaN-based alloy layer disposed on a first portion of the first GaN-based alloy layer;
forming source, drain, and gate contact structures supported by the first GaN-based alloy layer; and
forming a p-type GaN layer (pGaN) on the first GaN-based alloy layer, wherein the gate contact structure is positioned on the pGaN layer.

16. A method, comprising:
providing a substrate including a gallium nitride (GaN) layer, a first GaN-based alloy layer disposed on the GaN layer and having a top side;
forming a second GaN-based alloy layer disposed on a first portion and a second portion of the first GaN-based alloy layer but not on a third portion of the first GaN-based alloy layer; and
forming source, drain, and gate contact structures supported by the first GaN-based alloy layer, the source and drain contact structures contacting the second GaN-based alloy layer on the first and second portions, respectively, and the gate contact structure over the third portion of the first GaN-based alloy layer not contacting the second GaN-based alloy layer.

17. A transistor comprising:
a substrate including a gallium nitride (GaN) layer, a first GaN-based alloy layer disposed on the GaN layer and having a top side;
a second GaN-based alloy layer disposed on a first portion and a second portion of the first GaN-based alloy layer but not on a third portion of the first GaN-based alloy layer; and
source, drain, and gate contact structures supported by the first GaN-based alloy layer, the source and drain contact structures contacting the second GaN-based alloy layer on the first and second portions, respectively, and the gate contact structure over the third portion of the first GaN-based alloy layer not contacting the second GaN-based alloy layer.

* * * * *